US011977405B2

(12) United States Patent
Hirose et al.

(10) Patent No.: US 11,977,405 B2
(45) Date of Patent: May 7, 2024

(54) REFERENCE VOLTAGE GENERATOR CIRCUIT SUCH AS BAND GAP REFERENCE VOLTAGE GENERATOR CIRCUIT, AND METHOD OF GENERATING REFERENCE VOLTAGE

(71) Applicant: Nisshinbo Micro Devices Inc., Tokyo (JP)

(72) Inventors: Yohkoh Hirose, Amagasaki (JP); Kaoru Nakano, Sakai (JP)

(73) Assignee: NISSHINBO MICRO DEVICES INC., Tokyo (JP)

( * ) Notice: Subject to any disclaimer, the term of this patent is extended or adjusted under 35 U.S.C. 154(b) by 287 days.

(21) Appl. No.: 17/596,338

(22) PCT Filed: May 31, 2021

(86) PCT No.: PCT/JP2021/020718

§ 371 (c)(1),
(2) Date: Dec. 8, 2021

(87) PCT Pub. No.: WO2022/254537

PCT Pub. Date: Dec. 8, 2022

(65) Prior Publication Data

US 2023/0333587 A1 Oct. 19, 2023

(51) Int. Cl.
*G05F 1/567* (2006.01)
*G05F 3/24* (2006.01)
*G05F 3/26* (2006.01)

(52) U.S. Cl.
CPC .............. *G05F 3/245* (2013.01); *G05F 1/567* (2013.01); *G05F 3/267* (2013.01)

(58) Field of Classification Search
CPC .......... G05F 1/461; G05F 1/462; G05F 1/567; G05F 3/08; G05F 3/10; G05F 3/16;
(Continued)

(56) References Cited

U.S. PATENT DOCUMENTS 5,773,967 A * 6/1998 Tenten .................. G01R 35/00
323/314
10,635,127 B2 * 4/2020 Hirose ..................... G05F 3/30
(Continued)

FOREIGN PATENT DOCUMENTS

JP 2003-157119 5/2003
JP 2007-018377 1/2007
(Continued)

OTHER PUBLICATIONS

Dec. 14, 2023 Notification Of Transmittal Of Translation of the International Preliminary Report on Patentability, in connection with PCT/JP2021/020718.

*Primary Examiner* — Gary L Laxton
(74) *Attorney, Agent, or Firm* — Paul Teng

(57) ABSTRACT

A reference voltage generator circuit includes a band gap reference voltage circuit that generates a predetermined reference voltage, and a first correction current generator circuit that generates a first correction current in response to change in temperature. The first correction current generator circuit generates a plurality of voltage peaks in response to the change in temperature in the output voltage of the reference voltage generator circuit by injecting the first correction current into the band gap reference voltage circuit, and output voltage characteristics configuring each of the plurality of voltage peaks are made such that the output voltage varies continuously with respect to the change in temperature. The first correction current generator circuit includes a temperature setting circuit that can change the plurality of temperatures corresponding to each of the plurality of voltage peaks.

13 Claims, 8 Drawing Sheets

(58) Field of Classification Search
CPC ... G05F 3/20; G05F 3/22; G05F 3/222; G05F 3/225
See application file for complete search history.

(56) References Cited

U.S. PATENT DOCUMENTS

| | | | | |
|---|---|---|---|---|
| 2014/0091780 | A1* | 4/2014 | Hu | G05F 3/30<br>323/314 |
| 2020/0333821 | A1* | 10/2020 | Tomonaga | G05F 3/16 |

FOREIGN PATENT DOCUMENTS

| | | |
|---|---|---|
| JP | 2013-092926 | 5/2013 |
| JP | 6765119 B2 | 9/2020 |

* cited by examiner

Vout
30
10
VDD
11
R1
R2
R3
P1
P2
Q1
Q2
CM2
Q7
Q8
CM1
Q5
Q6
20B
R21
P7
Q21
Is
Vb21
21
R4
P4
P6
P5
Q4
Vb4
Rta
Rtb
Rb
Rx
P3
32
Q3

REFERENCE VOLTAGE GENERATOR CIRCUIT SUCH AS BAND GAP REFERENCE VOLTAGE GENERATOR CIRCUIT, AND METHOD OF GENERATING REFERENCE VOLTAGE

TECHNICAL FIELD

The present invention relates to a reference voltage generator circuit such as a band gap reference voltage generator circuit, and a method of generating a reference voltage.

BACKGROUND ART

In many systems and semiconductor circuits, a bandgap reference voltage circuit is employed as means of generating a DC reference voltage that is reasonably stable with respect to temperature. In the past, many attempts have been made to reduce the temperature dependence of this output and to generate a reference voltage with high accuracy.

Conventional bandgap reference voltage generator circuits generate a reference voltage by adding two voltages whose temperature gradient is opposite and balanced to each other. One voltage is the forward voltage of the PN junction, which is the base-to-emitter voltage Vbe with negative temperature characteristics (base-to-emitter voltage of a bipolar transistor, whose temperature coefficient is −2 mV/° C.). The other voltage is the voltage due to the positive temperature characteristic of the difference in forward voltage ΔVbe of the PN junction.

For example, in Patent Document 1, the objective is to provide a reference voltage generator circuit with both high and low temperature characteristics, and an expanded temperature range in which good voltage accuracy can be obtained. The reference current generator circuit is a reference voltage generator circuit that outputs a reference voltage based on a band gap. The reference voltage generator circuit has a PN junction element and a plurality of resistive elements, and a reference voltage output unit that outputs a voltage in which the band gap of the PN junction element is corrected by the plurality of resistive elements. Furthermore, the reference voltage generator circuit has a switch that changes the temperature characteristics of the output voltage of the reference voltage output unit, and a switch operation unit that operates the switch according to the temperature.

Since the voltage at which the two voltages described above are added also includes the nonlinear term of the base-to-emitter voltage Vbe, the output voltage has an upward convex curve centered at a certain temperature. However, depending on the intended use, the temperature characteristics may not be sufficient. In order to solve this problem, Patent Document 2 discloses a reference voltage generator circuit that can improve the temperature dependence of the output voltage with a simpler circuit as compared to the prior art.

PRIOR ART DOCUMENT

Patent Document

Patent Document 1: Japanese patent laid-open publication No. JP2007-018377A; and Patent Document 2: Japanese Patent No. JP6765119B2.

SUMMARY OF THE INVENTION

Problem to be Solved by the Invention

However, although many inventions related to bandgap reference voltage circuits have been reported, many of them have insufficient temperature characteristics depending on the application and temperature range to be used. In addition, there are circuits that correct the output voltage in response to change in temperatures, but they have the problem of limiting the correction conditions, such as complicated circuits and the fact that the correction temperature is uniquely determined by the characteristics of the element used.

The purpose of the present invention is to solve the above problems and to provide a reference voltage generator circuit and a method of generating a reference voltage, that can improve the temperature dependence of the output voltage with a simple circuit as compared to the prior art.

Means for Dissolving the Problem

According to one aspect of the present invention, there is provided a reference voltage generator circuit including a band gap reference voltage circuit, and a reference voltage generator circuit. The band gap reference voltage circuit generates a predetermined reference voltage, and the reference voltage generator circuit includes a first correction current generator circuit that generates a first correction current in response to a change in temperature. The first correction current generator circuit generates a plurality of voltage peaks in response to change in temperature in the output voltage of the reference voltage generator circuit by injecting the first correction current into the band gap reference voltage circuit, and output voltage characteristics configuring each of the plurality of voltage peaks are configured such that the output voltage varies continuously in response to the change in temperature. The first correction current generator circuit includes a temperature setting circuit that changeably sets a plurality of temperatures corresponding to the plurality of voltage peaks.

Effect of the Invention

Therefore, according to the reference voltage generator circuit of the present invention, the temperature dependency of the output voltage can be improved with a simple circuit as compared to the prior art.

BRIEF DESCRIPTION OF DRAWINGS

FIG. 7(b) is a graph showing temperature characteristics of an output voltage of the reference voltage generator circuit of Embodiment 1.

BEST MODE FOR CARRYING OUT THE INVENTION

The following is a description of the embodiments and variations of the present invention with reference to the drawings. The same numerical references are attached to the same or similar components.

Findings of the Inventor

In the prior art, since the correction temperature of the temperature characteristics is uniquely determined by the base-emitter voltage Vbe characteristic of the bipolar transistor, the temperature characteristics may be insufficient in some temperature ranges. The purpose of this system is to reduce the temperature deviation of the output voltage due to temperature and to provide a highly accurate base voltage without increasing the circuit scale as compared to the prior art.

Embodiment 1

Figure 1:
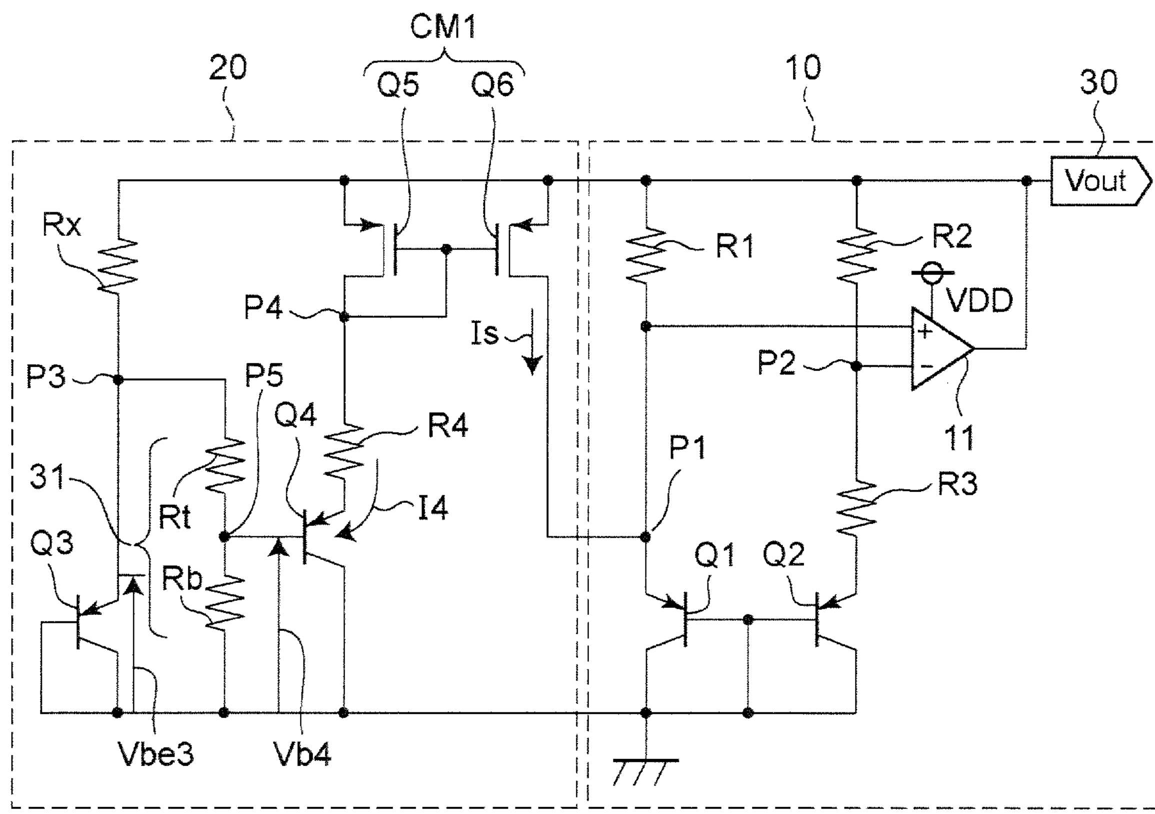
FIG. 1 is a circuit diagram showing an example of configuration of a reference voltage generator circuit according to Embodiment 1.

FIG. 1 is a circuit diagram of an example of configuration of a reference voltage generator circuit according to Embodiment 1. Referring to FIG. 1, the reference voltage generator circuit according to Embodiment 1 is further equipped with a correction current generator circuit 20 for the band gap reference voltage circuit 10 of the prior art. As with the circuits of the prior art, by using the operating characteristics of bipolar transistors and varying the PTAT current Iptat (current proportional to absolute temperature) with respect to temperature, the reference voltage generator circuit has two peak voltages in place of one in the temperature characteristics of the output voltage.

Referring to FIG. 1, the band gap reference voltage circuit 10 is provided that generates a predetermined reference voltage using the band gap of a bipolar transistor, and is configured to include resistors R1 to R3, bipolar transistors Q1 and Q2, and an operational amplifier 11. The output voltage terminal 30 is grounded through resistor R1 and the emitter and collector of the bipolar transistor Q1, as well as through resistors R2 and R3, and the emitter and collector of the bipolar transistor Q2. In addition, the base and collector of the bipolar transistors Q1 and Q2 are connected to each other and grounded. The voltage at the connection point P1 between the resistor R1 and the emitter of the bipolar transistor Q1 is applied to the non-inverting input terminal of the operational amplifier 11, which operates with the supply voltage VDD, and the voltage at the connection point P2 between the resistor R2 and the resistor R3 is applied to the inverting input terminal of the operational amplifier 11. Then, a predetermined constant voltage is outputted from the output terminal of the operational amplifier 11 through the output voltage terminal 30.

The correction current generator circuit 20 is configured to include resistors R4 and Rx, a voltage-divider circuit 31 including voltage-divider resistors Rt and Rb, and a current mirror circuit CM1 including bipolar transistors Q3 and Q4, and MOS transistors Q5 and Q6. The output voltage terminal 30 is grounded through the emitter and base of the resistor Rx and the emitter-grounded bipolar transistor Q3. The voltage at the connection point P3 of the resistor Rx and the emitter of the bipolar transistor Q3 is divided by the voltage-divider circuit 31, and the voltage at the connection point P5 of the voltage-divider resistors Rt and Rb connected in series with each other is applied to the base of the bipolar transistor Q4 (which is an example of a control terminal). In addition, the output voltage terminal 30 is grounded through the source and drain of the MOS transistor Q5, resistor R4, and the emitter and collector of the bipolar transistor Q4. The output voltage terminal 30 is connected to the connection point P1 of the band gap reference voltage circuit 10 through the source and drain of the MOS transistor Q6. In this case, the gate and drain of the MOS transistor Q5 and the gate of the MOS transistor Q6 are connected to each other, and the MOS transistors Q5 and Q6 configures a current mirror circuit CM1.

It is noted that the bipolar transistors Q1 to Q4 are each of, for example, PNP-type bipolar transistor, and the MOS transistors Q5 and Q6 are each of, for example, P-channel MOS transistor.

The operation of the reference voltage generator circuit configured as described above is described below.

The operation of the correction current generator circuit 20 of FIG. 1 depends on the base voltage Vb4 of the bipolar transistor Q4. The bipolar transistor Q4 of the correction current generator circuit 20 operates when the base voltage Vb4 exceeds its threshold voltage, and the emitter current flows into the emitter of the bipolar transistor Q4. In addition, the emitter current I4 flowing through the bipolar transistor Q4 is mirrored by the current mirror circuit CM1 of the correction current generator circuit 20. The correction current Is, which is proportional to the emitter current I4, flows into the emitter of the bipolar transistor Q1 through the bipolar transistor Q6. In this case, for example, when the gate sizes of the pair of MOS transistors Q5 and Q6 of the current mirror circuit CM1 are the same as each other, then I4=Is. In the following explanation, this case will be assumed for convenience. For example, it is preferable to set the first gate sizes of the MOS transistors Q1, Q3, and Q4 to be the same as each other, and to set the gate size of the MOS transistor Q2 to M times (M>1) the first gate size.

Figure 2:
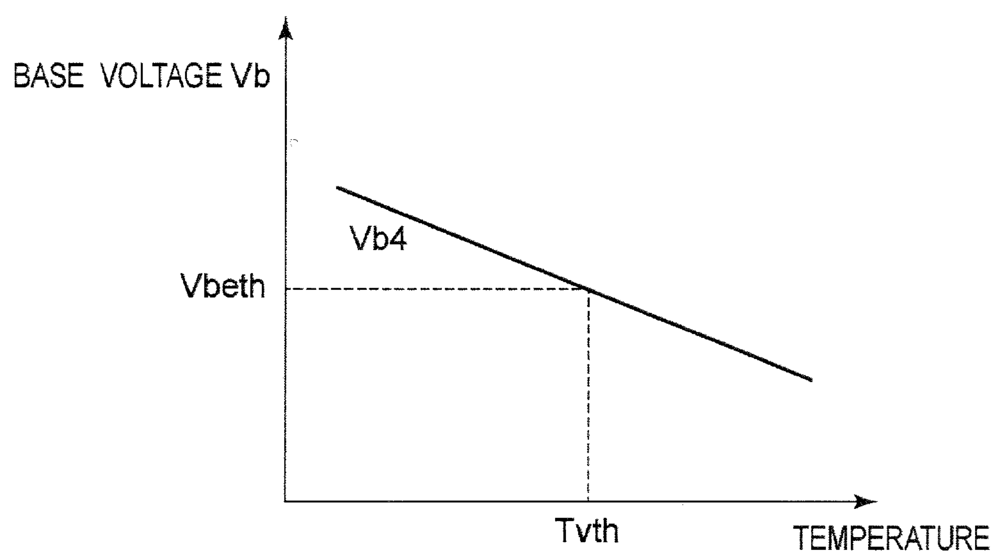
FIG. 2 is a graph showing temperature characteristics of a base voltage Vb4 in a correction current generator circuit 20 of FIG. 1.

FIG. 2 is a graph showing temperature characteristics of the base voltage Vb4 of the bipolar transistor Q4 in the correction current generator circuit 20 of FIG. 1. As can be seen from FIG. 2, the base voltage Vb4 of the bipolar transistor Q4 has a negative slope with respect to temperature.

Figure 3:
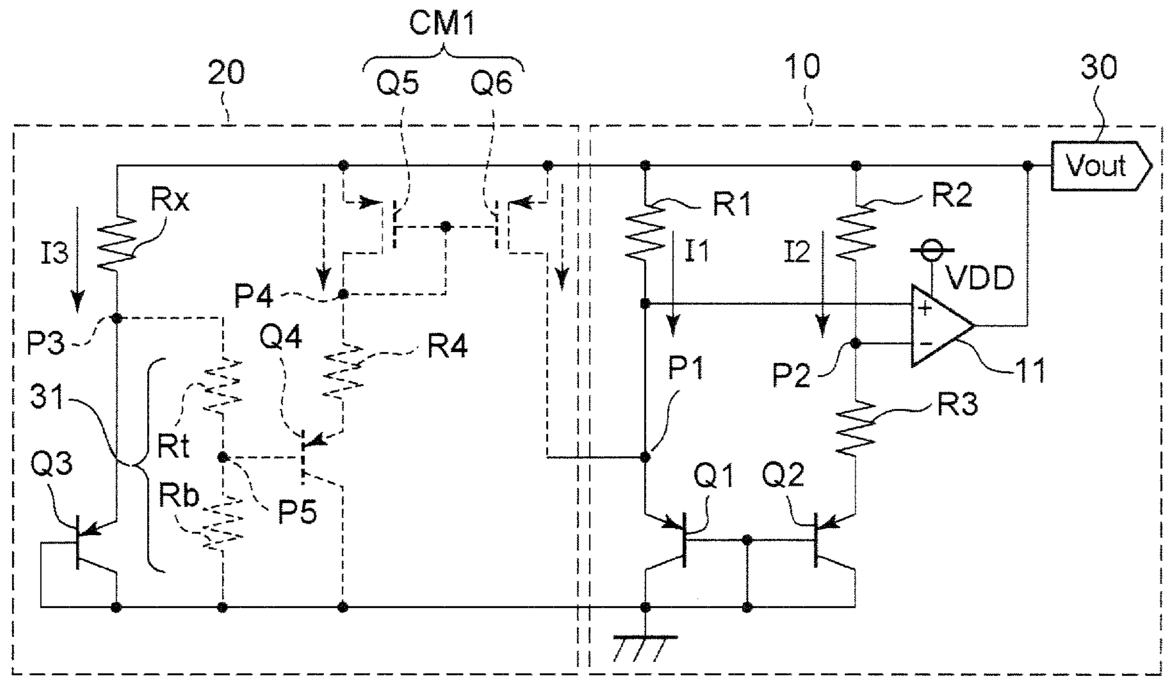
FIG. 3 is a circuit diagram showing currents I1 to I3 flowing in the reference voltage generator circuit of FIG. 1 when a temperature Temp is less than a temperature threshold Tvth.
Figure 4:
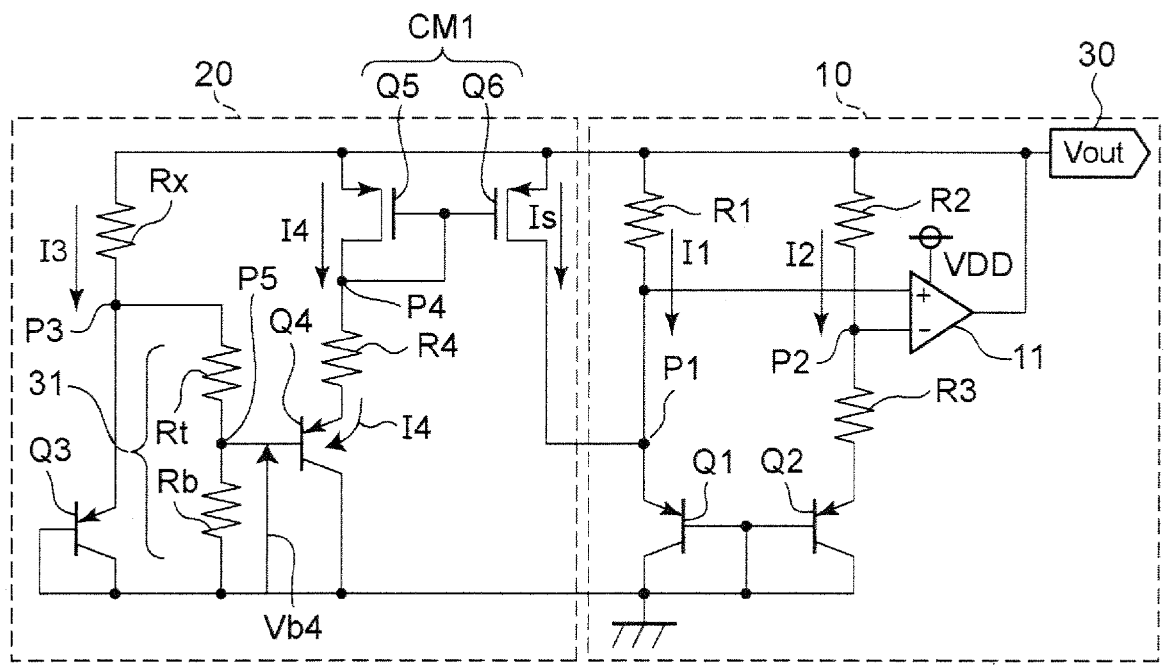
FIG. 4 is a circuit diagram showing currents I1 to I4 flowing when the temperature Temp is above the temperature threshold Tvth in the reference voltage generator circuit of FIG. 1.

FIG. 3 is a circuit diagram showing currents I1 to I3 flowing in the reference voltage generator circuit of FIG. 1 when the temperature Temp is less than the temperature threshold Tvth. FIG. 4 is a circuit diagram showing currents I1 to I4 flowing in the reference voltage generator circuit of FIG. 1 when the temperature Temp is above the temperature threshold Tvth. In FIG. 3, each of the elements indicated by the dotted line represents non-operation thereof. The temperature when generating the threshold voltage Vbeth at which the bipolar transistor Q4 operates is defined as the temperature threshold Tvth. The reference voltage generator circuit configured as described above operates as follows under two conditions depending on the temperature: below the temperature threshold Tvth and above the temperature threshold Tvth.

(1) When Temp<Tvth, then Is=0 and PTAT current Iptat=I1 (only) as shown in FIG. 3.

(2) When Temp Tvth, then as shown in FIG. 4, Is=I4 and the emitter current I4 is added, resulting in the PTAT current Iptat=I1+I4.

Figure 5:
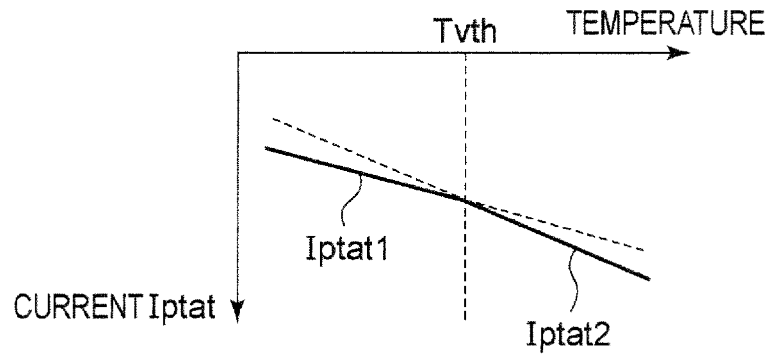
FIG. 5 is a graph showing temperature characteristics of the PTAT (Proportional To Absolute Temperature) current Iptat in the reference voltage generator circuit of FIG. 1.

FIG. 5 shows temperature characteristics of the PTAT current Iptat in the reference voltage generator circuit of FIG. 1. As shown in FIG. 5, the PTAT current Iptat to the temperature can realize two PTAT currents Iptat1 and Iptat2 with different slopes, bounded by the temperature threshold Tvth.

Next, the operations of the reference voltage generator circuit of the prior art and the reference voltage generator circuit of Embodiment 1 are compared with each other as follows.

Figure 6:
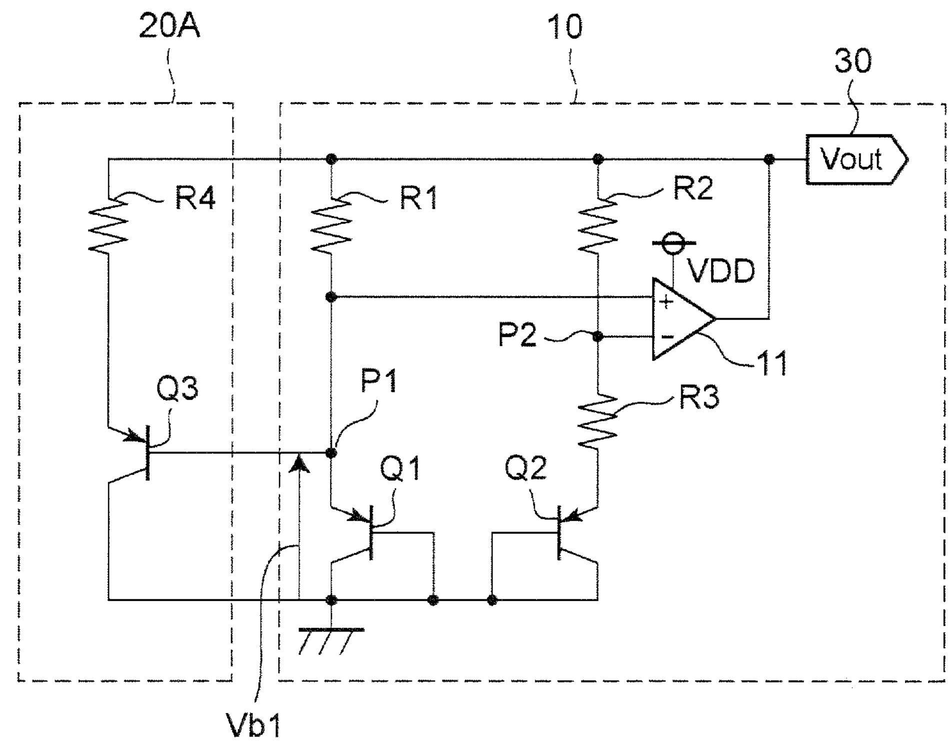
FIG. 6 is a circuit diagram showing a configuration of a reference voltage generator circuit of a prior art disclosed in Patent Document 2.

FIG. 6 shows a circuit diagram of configuration of a reference voltage generator circuit according to the prior art disclosed in Patent Document 2. The reference voltage generator circuit of FIG. 6 is characterized in that a correction current generator circuit 20A is provided for the band gap reference voltage circuit 10. The correction current generator circuit 20A is configured to include a resistor R4 and a bipolar transistor Q3.

The operation of the correction current generator circuit 20A of FIG. 6 depends on the base-to-emitter voltage Vbe1 of the bipolar transistor Q1. The bipolar transistor Q3 of the correction current generator circuit 20A operates when the base-to-emitter voltage Vbe1 of the bipolar transistor Q1 exceeds its threshold voltage, and the base current of the bipolar transistor Q3 flows into the bipolar transistor Q1, so that the PTAT current Iptat is changed. Since the base-to-emitter voltage Vbe1 of the bipolar transistor Q3 is uniquely determined by the process characteristics of the bipolar transistor Q1, we have such a problem that the prior art cannot select the temperature at which the PTAT current Iptat changes, namely, the temperature at which the output voltage is corrected.

In contrast, in Embodiment 1 of the present invention, the operation of the correction current generator circuit 20 depends on the base voltage Vb4, which is obtained by dividing the base-to-emitter voltage Vbe3 of the bipolar transistor Q3 by the voltage-divider resistors Rt and Rb of the voltage-divider circuit 31. Therefore, by selecting the resistance ratio of the voltage-divider resistors Rt to Rb, it is possible to select the temperature at which the PTAT current Iptat changes, that is, the correction temperature.

Figure 7:
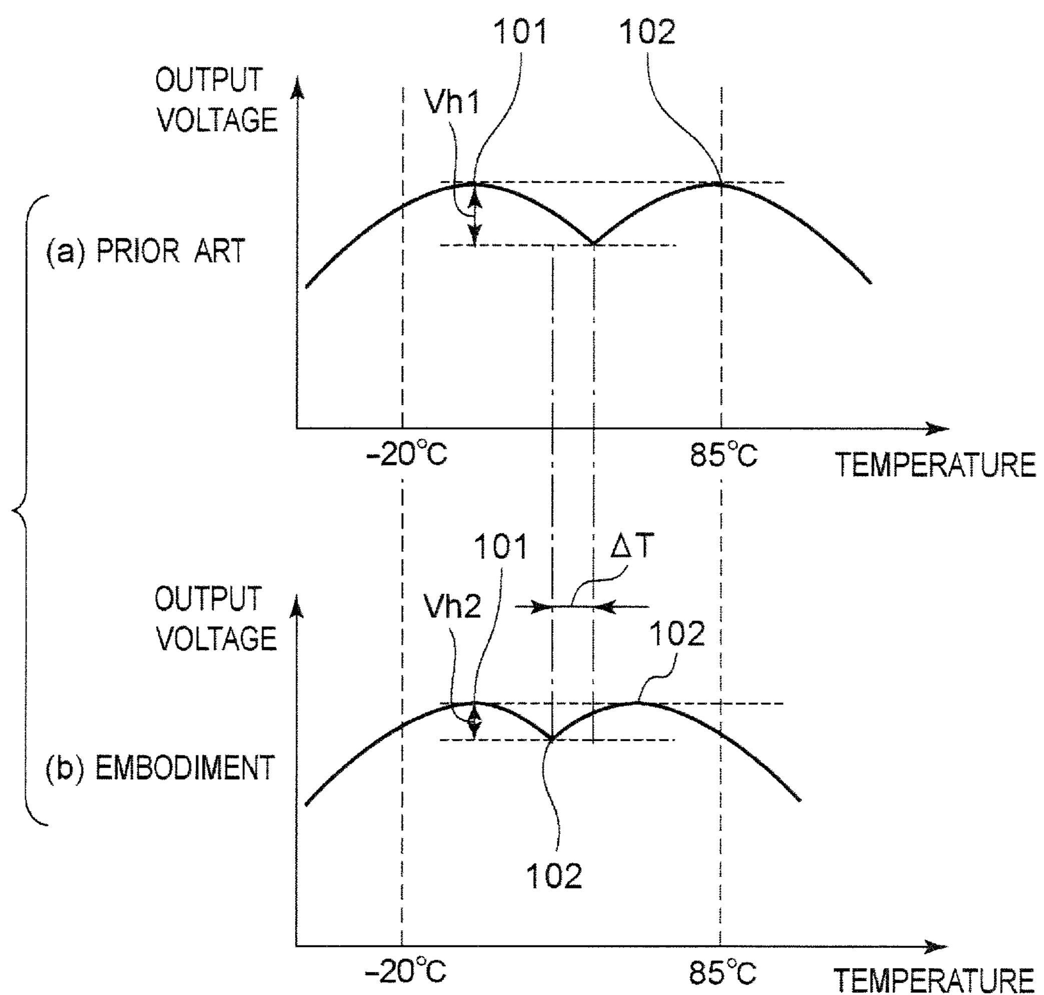
FIG. 7(*a*) is a graph showing temperature characteristics of an output voltage of the reference voltage generator circuit of the prior art.

FIG. 7(*a*) is a graph showing temperature characteristics of an output voltage of the reference voltage generator circuit according to the prior art, and FIG. 7(*b*) is a graph showing temperature characteristics of an output voltage of the reference voltage generator circuit according to Embodiment 1. In FIG. 7(*a*) and FIG. 7(*b*), 101 denotes a low temperature side output voltage peak, and 102 denotes a high temperature side output voltage peak.

In FIG. 7(*a*) of the prior art, the high temperature side output voltage peak 102 is around 85° C. In contrast, in FIG. 7(*b*) of Embodiment 1, the low temperature side output voltage peak 101 is around 85° C. In contrast, FIG. 7(*b*) of Embodiment 1 shows that the position of the high temperature side output voltage peak 102 can be moved to the lower temperature side by a temperature difference ΔT toward the lower temperature side output voltage peak 101 by changing the base voltage Vb4, for example, by selecting the resistance ratio of the voltage dividing resistors Rt and Rb. Therefore, it is clear from FIG. 7(*b*) that the temperature deviation of the output voltage is improved for the temperature range of −20° C. to 85° C. (Vh2<Vh1). As a result, further improvement of the temperature characteristics can be expected by realizing the circuit with the variable correction temperature. In addition, the correction temperature can be set by switching only the resistance value of the voltage-divider circuit 31. Therefore, it is possible to change the correction temperature by trimming at the manufacturing stage, for example, which means that it is possible to set the output voltage according to the temperature range only by trimming at the manufacturing stage, for example.

It is noted that, instead of the changing setting of the resistance value by trimming to at least one of the voltage-divider resistors Rt and Rb of the voltage-divider circuit 31 (which may be performed at the time of manufacture, or before or at the time of manufacture and shipment), at least one of the voltage-dividers Rt and Rb of the voltage-divider circuit 31 may be configured with a variable resistance or a semi-fixed resistance. In this case, the change setting of the resistance value may be configured so that it can be changed analogically, or it may be configured so that it can be changed digitally in response to a digital indication signal, for example.

In the reference voltage generator circuit according to Embodiment 1 configured as described above, the correction current generator circuit 20 injects a predetermined correction current Is into the connection point P1 of the band gap reference voltage circuit 10. This generates a plurality of voltage peaks against change in temperature in the output voltage of the band gap reference voltage circuit 10, and the output voltage characteristics including each of the plurality of voltage peaks are configured so that the output voltage varies continuously against change in temperature. In addition, the bipolar transistor Q4 and the voltage-divider circuit 31 include a temperature setting circuit that changeably sets a plurality of temperatures corresponding to each of the plurality of voltage peaks.

As explained above, according to the present Embodiment, since the correction temperature of the output voltage is selective regardless of the process characteristics, a more accurate reference voltage can be provided by setting a more optimal correction temperature according to the temperature range. In addition, since the correction temperature can be set by switching only the resistance value, it can be easily selected by trimming during mass production. In other words, as compared to the prior art, this system enables the correction to be applied at a more optimal temperature according to the temperature range of the target device, which can be expected to further reduce the temperature dependence of the output voltage. In addition, it is possible to change the correction temperature by trimming at the manufacturing stage, for example, which means that the output voltage can be set according to the temperature range at the manufacturing stage.

Embodiment 2

Figure 8:
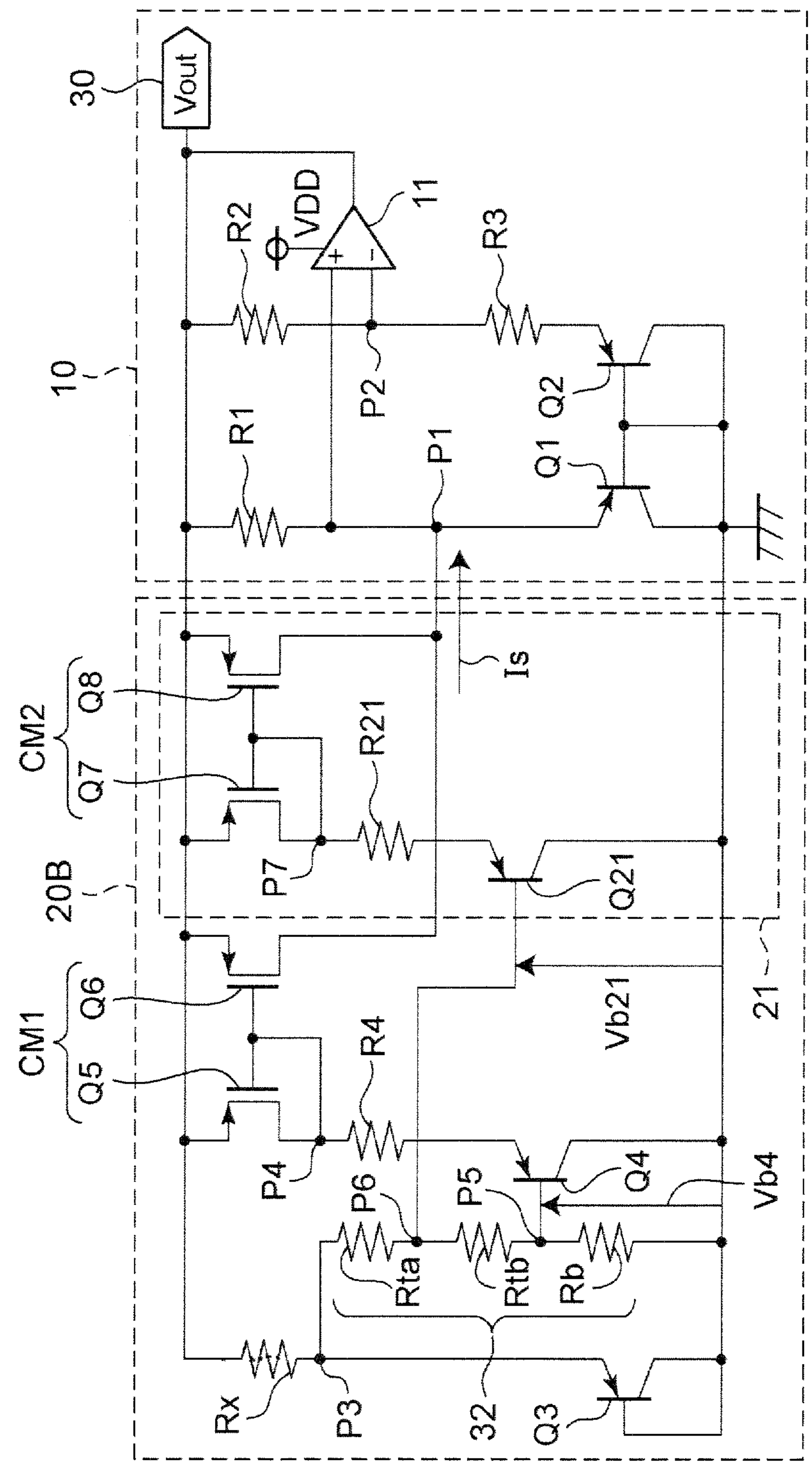
FIG. 8 is a circuit diagram showing an example of configuration of a reference voltage generator circuit according to Embodiment 2.

FIG. 8 is a circuit diagram showing an example of configuration of a reference voltage generator circuit according to Embodiment 2. As shown in FIG. 8, the reference voltage generator circuit according to Embodiment 2 differs in the following points as compared to the reference voltage generator circuit according to Embodiment 1 of FIG. 1:

(1) A correction current generator circuit 20B is provided instead of the correction current generator circuit 20, and the following points are different between the correction current generator circuit 20B and the correction current generator circuit 20.

(1A) Instead of the voltage-divider circuit 31, the reference voltage generator circuit includes a voltage-divider circuit 32 with three voltage-dividers Rta, Rtb, and Rb connected in series with each other.

(1B) A correction current generator circuit 21 is further provided, which has the same configuration as the correction current generator circuit configured to include a current mirror circuit CM1, a resistor R4 and a bipolar transistor Q4 in the correction current generator circuit 20. In this case, the correction current generator circuit 21 is configured to include a current mirror circuit CM2 including MOS transistors Q7 and Q8, a resistor R21, and a bipolar transistor Q21.

The differences are explained below.

Referring to FIG. 8, the voltage at the connection point P6 of the voltage-divider resistors Rta and Rtb is applied to the base of the bipolar transistor Q21. In addition, in the correction current generator circuit 21, the output voltage terminal 30 is grounded through the source and drain of the MOS transistor Q7, the connection point P7, the resistor R21, and the emitter and collector of the bipolar transistor Q21. The gate and drain of the MOS transistor Q7 are connected to each other, and the gate of the MOS transistor Q7 is connected to the gate of the MOS transistor Q8. Furthermore, the drain of the MOS transistor Q8 of the current mirror circuit CM2 is connected to the connection point P1 of the band gap reference generator circuit 10. It is noted that the bipolar transistor Q21 is of, for example, a PNP-type bipolar transistor, and the MOS transistors Q7 and Q8 are each of, for example, P-channel MOS transistor.

It is noted that instead of setting the change in resistance value by trimming for at least one of the voltage-divider resistors Rta, Rtb, and Rb of the voltage-divider circuit 32, at least one of the voltage-divider resistors Rta, Rtb, and Rb of the voltage-divider circuit 32 may be configured with a variable resistance or a semi-fixed resistance.

According to the reference voltage generator circuit of Embodiment 2 configured as described above, the correction current generator circuit 21 that corrects the correction current according to the threshold voltage of the bipolar transistor Q21 is added. In this case, the operating principle of the correction current generator circuit 21 is the same as in that of Embodiment 1. Since the base voltage Vb21 of the bipolar transistor Q21 is higher than the base voltage Vb4 of the bipolar transistor Q4, the operation start temperature of bipolar transistor Q21 is higher than that of Embodiment 1. As a result, the correction of the correction current Is to flow into the connection point P1 can be performed in three steps, and the correction of the correction current Is can be corrected in more detail as compared to the reference voltage generator circuit of Embodiment 1.

In the above-mentioned Embodiment 2, one correction current generator circuit 21 is provided, but it may be configured by increasing the number of voltage dividing resistors in the voltage-divider circuit 32 and providing a plurality of correction current generator circuits 21 (hereinafter referred to as Modified Embodiment of Embodiment 2). This allows the correction of the correction current Is to be added in multiple steps. As a result, the correction of the correction current Is can be corrected in more detail.

Embodiment 3

Figure 9:
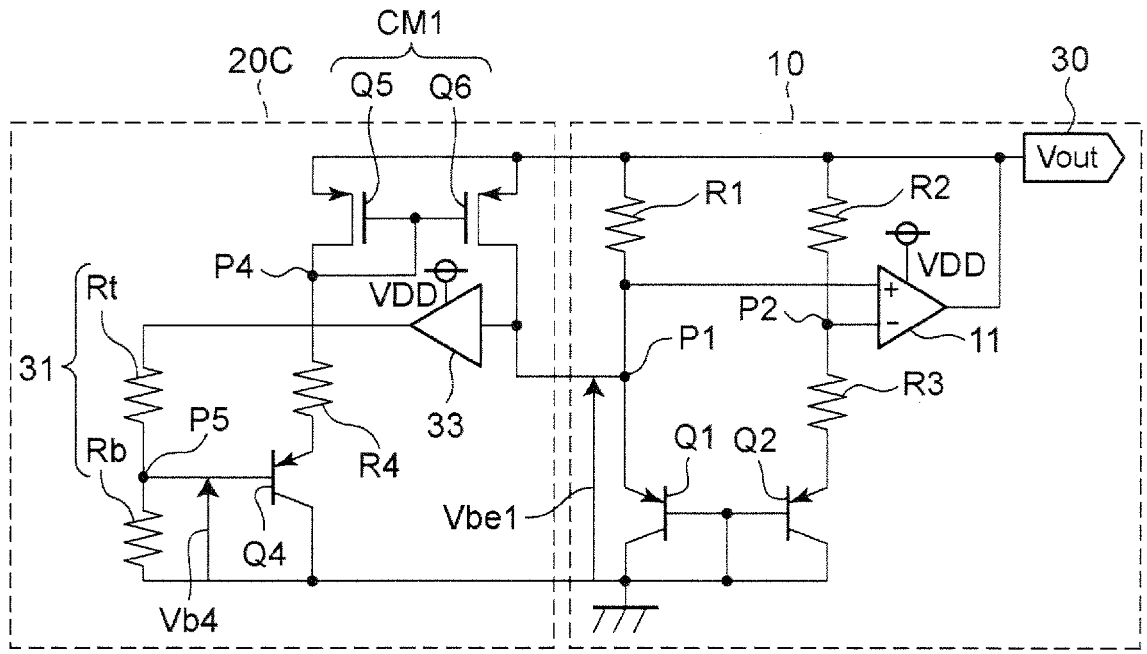
FIG. 9 is a circuit diagram showing an example of configuration of a reference voltage generator circuit according to Embodiment 3.

FIG. 9 is a circuit diagram showing an example of configuration of a reference voltage generator circuit according to Embodiment 3. As shown in FIG. 9, the reference voltage generator circuit according to Embodiment 3 differs from the reference voltage generator circuit according to Embodiment 1 shown in FIG. 1 in the following points:

(1) A correction current generator circuit 20C is provided instead of the correction current generator circuit 20, and the following points are different between the correction current generator circuit 20C and the correction current generator circuit 20.

(1A) The correction current generator circuit 20C is configured to include a current mirror circuit CM1, a voltage-divider circuit 31, a resistor R4, a bipolar transistor Q4, and a buffer circuit 33, excluding the resistor Rx and the bipolar transistor Q3 of FIG. 1.

The differences are explained below.

Referring to FIG. 9, the buffer circuit 33 applies a buffered voltage obtaining by buffering (and amplifying) the base-to-emitter voltage Vbe1 of the bipolar transistor Q1 to the voltage-divider circuit 31, and uses the same buffered voltage for the pull-up voltage of the resistor Rt. This realizes the circuit configuration that operates in the same manner as the reference voltage generator circuit of Embodiment 1. In this case, the buffer circuit 33 can be configured with a source follower circuit or a voltage follower circuit.

The reference voltage generator circuit according to Embodiment 3 configured as described above has the same action and advantageous effect as that of Embodiment 1.

As in the Modified Embodiment of Embodiment 2, the number of divider resistors of the voltage-divider circuit 31 is increased, and then, one or more correction current generator circuits configured to include the current mirror circuit CM1, the voltage-divider circuit 31, the resistor R4, the bipolar transistor Q4, and the buffer circuit 33 are added. This makes it possible to correct the correction current Is in multiple steps. As a result, the correction of the correction current Is can be corrected in more detail.

Embodiment 4

Figure 10:
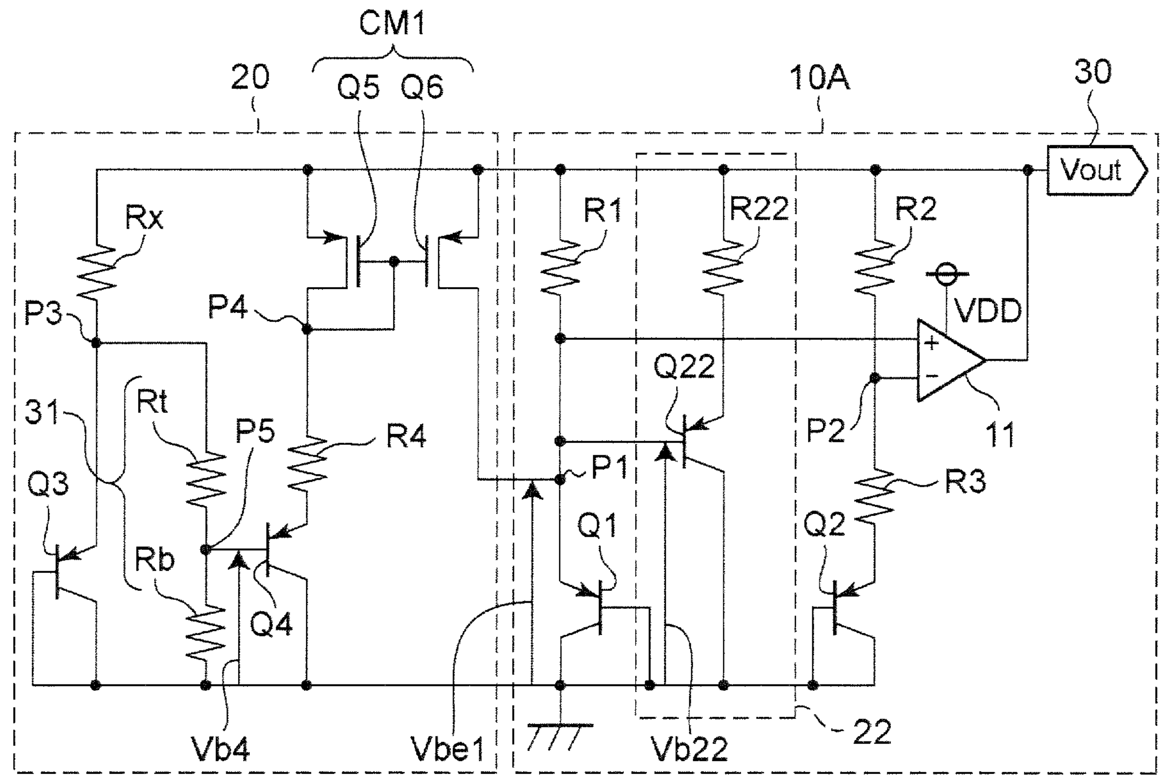
FIG. 10 is a circuit diagram showing an example of configuration of a reference voltage generator circuit according to Embodiment 4.

FIG. 10 is a circuit diagram showing an example of configuration of a reference voltage generator circuit according to Embodiment 4. As shown in FIG. 10, the reference voltage generator circuit according to Embodiment 4 differs from the reference voltage generator circuit according to Embodiment 1 in the following respects:

(1) A band gap reference voltage circuit 10A is provided instead of the band gap reference voltage circuit 10.

(2) Compared with the band gap reference voltage circuit 10, the band gap reference voltage circuit 10A is further equipped with a correction current generator circuit 22.

The differences are explained below.

Referring to FIG. 10, the correction current generator circuit 22 is configured to include a resistor R22 and a bipolar transistor Q22. The output voltage terminal is grounded through the emitter and collector of the resistor R22 and the bipolar transistor Q22, and its base is connected to the connection point P1. It is noted that the bipolar transistor Q22 is of a PNP-type bipolar transistor, for example.

In the correction current generator circuit 20 shown in FIG. 1, when the base voltage Vb4, which is obtained by dividing the base-to-emitter voltage Vbe3 of the bipolar transistor Q3 by the resistive voltage-divider circuit 31, exceeds the threshold voltage, the bipolar transistor Q4 operates. On the other hand, in the correction current generator circuit 22 shown in FIG. 10, when the base-to-emitter voltage Vbe1 of the bipolar transistor Q1 exceeds its threshold voltage, the bipolar transistor Q22 is turned on and starts to operate, and the base current flows into the bipolar transistor Q1 through the connection point P1. In the correction current generator circuit 22 of FIG. 10, the base voltage Vb22 is higher than that of the correction current generator circuit 10 of FIG. 1 due to the absence of the voltage-divider circuit 31, and so the operation start temperature of the bipolar transistor Q22 is higher than that of Embodiment 1. This allows the voltage peak 103 shown in FIG. 11 below to be generated.

Figure 11:
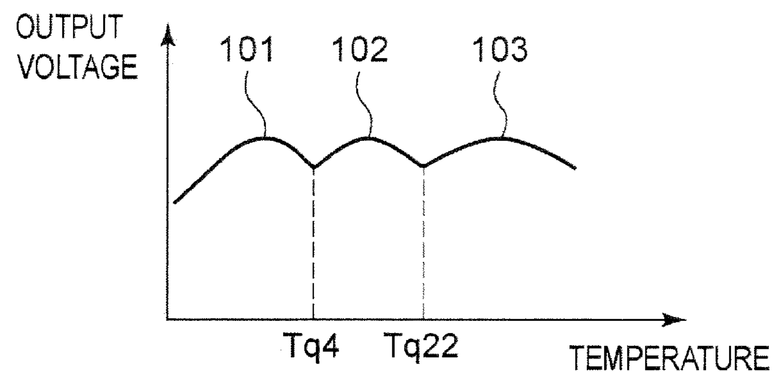
FIG. 11 is a graph showing temperature characteristics of an output voltage of the reference voltage generator circuit of FIG. 10.

FIG. 11 is a graph showing temperature characteristics of an output voltage of the reference voltage generator circuit of FIG. 10. As can be seen from FIG. 11, in addition to the two output voltage peaks 101 and 102 generated by the correction current generator circuit 10 of FIG. 1, the output voltage peak 103 by the correction current generator circuit 22 can be generated. Therefore, as a result, the current is corrected in three stages, which is effective when dealing with voltage drops at high temperatures. Compared to the reference voltage generator circuit of FIG. 6, in addition to the 3-step correction, the correction at low temperature can be added, and a more accurate output voltage can be provided.

Modified Embodiment 1

Figure 12:
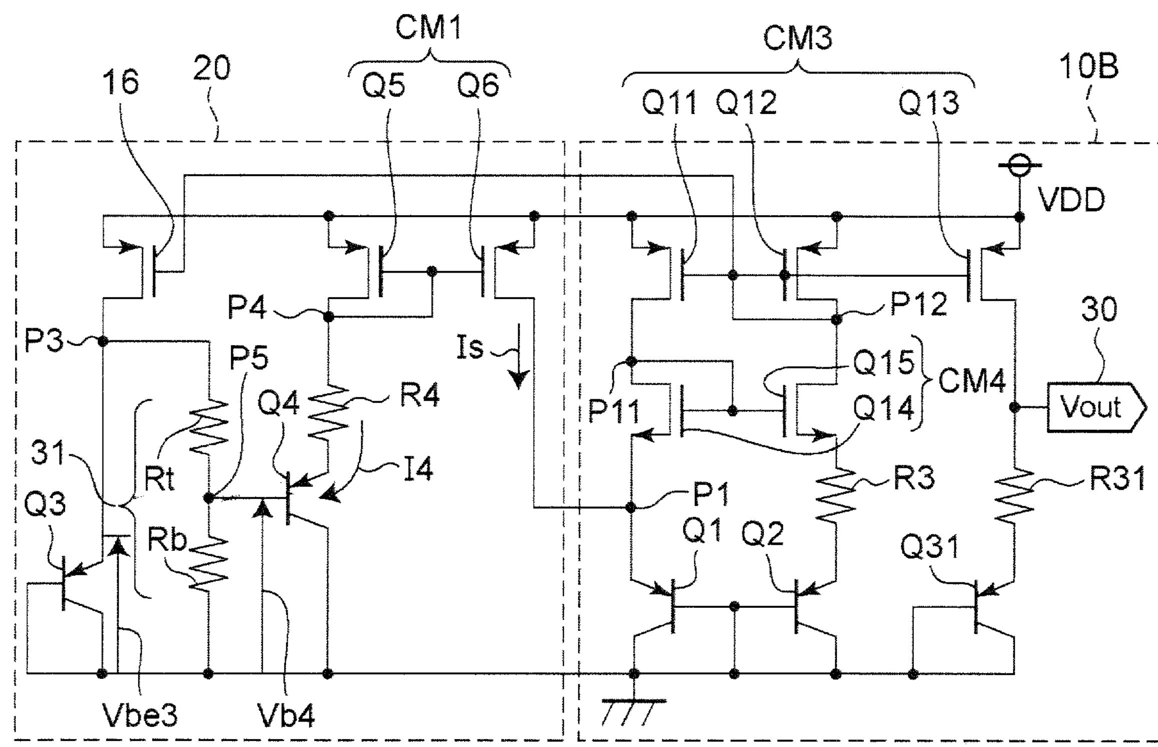
FIG. 12 is a circuit diagram showing an example of configuration of a reference voltage generator circuit according to Modified Embodiment 1.

FIG. 12 is a circuit diagram showing an example of configuration of the reference voltage generator circuit according to Modified Embodiment 1. As shown in FIG. 12, the reference voltage generator circuit according to Modified Embodiment 1 differs in the following points as compared to the reference voltage generator circuit according to Embodiment 1 of FIG. 1:

(1) A band gap reference voltage circuit 10B is provided in place of the band gap reference voltage circuit 10.

(2) The band gap reference voltage circuit 10B is configured to include a current mirror circuit CM3 including MOS transistors Q11, Q12, and Q13, a current mirror circuit CM4 including MOS transistors Q14 and Q15, resistors R3 and R31, and the bipolar transistors Q1, Q2, and Q31. It is noted that the gate size of the MOS transistor Q31 should be preferably set to the same gate size as the bipolar transistor Q1.

(3) In the correction current generator circuit 20, a MOS transistor Q16 is provided in place of the resistor Rx. In this case, the source and drain of the MOS transistor Q16 are connected between the connection point P3 and the power supply voltage VDD, and the gate of the MOS transistor Q16 is connected to the respective gates of the MOS transistors Q11 and Q12 of the band gap reference voltage circuit 10B. It is noted that these MOS transistors Q11, Q12, and Q16 are configured to flow corresponding currents to each other.

The reference voltage generator circuit configured as described above operates in the same way as the reference voltage generator circuit of FIG. 1, and has the same action and advantageous effects. The configuration of the band gap reference voltage circuit 10B may be applied to Embodiments 2 to 4.

Modified Embodiment 2

Figure 13:
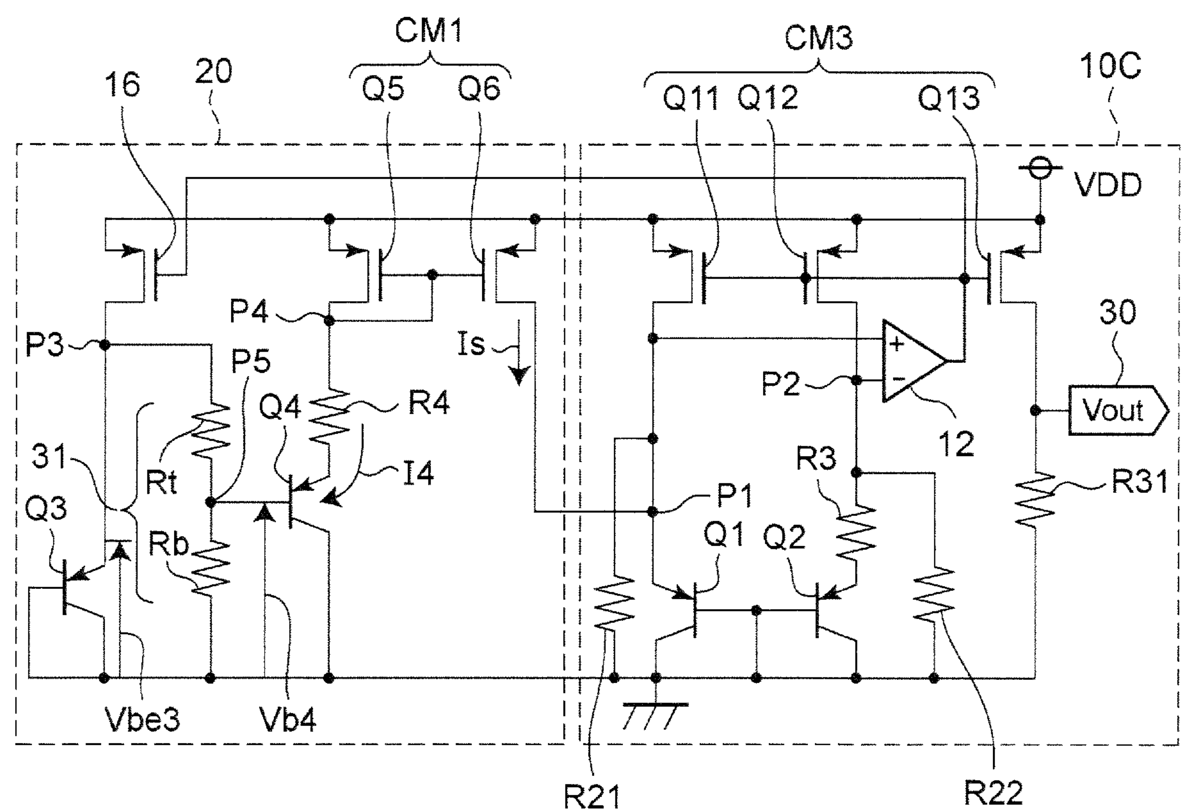
FIG. 13 is a circuit diagram showing an example of configuration of a reference voltage generator circuit according to Modified Embodiment 2.

FIG. 13 is a circuit diagram showing an example of configuration of a reference voltage generator circuit according to Modified Embodiment 2. As shown in FIG. 13, the reference voltage generator circuit according to Modified Embodiment 2 differs in the following points as compared to the reference voltage generator circuit according to Embodiment 1 of FIG. 1:

(1) A band gap reference voltage circuit 10C is provided in place of the band gap reference voltage circuit 10.

(2) The band gap reference voltage circuit 10C is configured to include a current mirror circuit CM3 including the MOS transistors Q11, Q12, and Q13, an operational amplifier 12, resistors R3, R21, R22, and R31, and the bipolar transistors Q1 and Q2.

(3) In the correction current generator circuit 20, a MOS transistor Q16 is provided in place of resistor Rx. In this case, the source and drain of the MOS transistor Q16 are connected between the connection point P3 and the power supply voltage VDD, and the gate of the MOS transistor Q16 is connected to the respective gates of the MOS transistors Q11, Q12, and Q13 of the band gap reference voltage circuit 10C. It is noted that these MOS transistors Q11, Q12, Q13, and Q16 are configured to flow corresponding currents to each other.

The reference voltage generator circuit configured as described above operates in the same way as the reference voltage generator circuit of FIG. 1, and has the same action and advantageous effects. The configuration of the band gap reference voltage circuit 10C may be applied to Embodiments 2 to 4.

INDUSTRIAL APPLICABILITY

As described in detail above, according to the present invention, the correction current generator circuit 20, 20B or 20C is provided for the band gap reference voltage circuit 10, 10B or 10C, or a correction current generator circuit 22 is provided in the band gap reference voltage circuit 10. As a result, the correction temperature of the output voltage is selective, regardless of the process characteristics, and thus a more optimal correction temperature is set according to the temperature range. Therefore, a more accurate reference voltage can be provided. In addition, since the correction temperature can be set by switching only the resistance value, it can be easily selected by trimming during mass production. In other words, as compared to the prior art, the present invention makes it possible to apply the correction at a more optimal temperature according to the temperature range of the target device, which can be expected to further reduce the temperature dependence of the output voltage. In addition, it is possible to change the correction temperature by trimming at the mass production stage, that is, it is possible to set the output voltage according to the temperature range at the mass production stage. In other words, the present invention can improve the temperature dependency of the output voltage with a simple circuit as compared to the prior art.

The invention claimed is:

1. A reference voltage generator circuit comprising:

a band gap reference voltage circuit that generates a predetermined reference voltage; and a first correction current generator circuit that generates a first correction current in response to a change in temperature, wherein the first correction current generator circuit generates a plurality of voltage peaks in response to change in temperature in an output voltage of the reference voltage generator circuit by injecting the first correction current into the band gap reference voltage circuit, wherein the output voltage includes a plurality of characteristics each having the voltage peak, and the output voltage varies continuously in response to the change in temperature, and wherein the first correction current generator circuit comprises a temperature setting circuit that changeably sets a plurality of temperatures corresponding to the plurality of voltage peaks.

2. The reference voltage generator circuit as claimed in claim 1, wherein the temperature setting circuit comprises:

a first bipolar transistor, and a voltage-divider circuit including a plurality of voltage dividing resistors connected in series with each other, and applying a predetermined base voltage to a base of the first bipolar transistor, wherein the temperature setting circuit is configured to change at least one temperature corresponding to at least one of the plurality of voltage peaks by changing a resistance value of at least one of the plurality of voltage dividing resistors.

3. The reference voltage generator circuit as claimed in claim 2, further comprising a buffer circuit that buffers a voltage corresponding to the first correction current from the first correction current generator circuit, and outputs a buffered voltage to the voltage-divider circuit.

4. The reference voltage generator circuit as claimed in claim 3, wherein the buffer circuit is configured to include a voltage follower circuit or a source follower circuit.

5. The reference voltage generator circuit as claimed in claim 1, comprising a plurality of the first correction current generator circuits, wherein the plurality of first correction currents from the plurality of first correction current generator circuits are injected into the band gap reference voltage circuit to generate three or more voltage peaks against the change in temperature in the output voltage of the reference voltage generator circuit.

6. The reference voltage generator circuit as claimed in claim 1, wherein the band gap reference voltage circuit further comprises a second correction current generator circuit that generates a second correction current in response to the change in temperature, and wherein the second correction current generator circuit injects the second correction current into the band gap reference voltage circuit to generate another voltage peak in the output voltage of the reference voltage generator circuit in response to the change in temperature.

7. The reference voltage generator circuit as claimed in claim 6, wherein the second correction current generator circuit further comprises a second bipolar transistor and a resistor connected in series with each other, and wherein the second correction current generator circuit generates the second correction current from a base of the second bipolar transistor, and generates another voltage peak at a temperature higher than the temperature of the voltage peak generated by the first correction current of the first correction current generator circuit.

8. A method of generating a reference voltage for a reference voltage generator circuit comprising a band gap reference voltage generator circuit that generates a predetermined reference voltage, and a first correction current generator circuit that generates a first correction current in response to change in temperature, wherein the first correction current generator circuit generates a plurality of voltage peaks in an output voltage of the reference voltage generator circuit in response to the change in temperature by injecting the first correction current into the band gap reference voltage circuit, wherein the output voltage includes a plurality of characteristics each having the voltage peak, and the output voltage varies continuously in response to the change in temperature, and wherein the method of generating the reference voltage includes a step of:

by a temperature setting circuit, changeably setting a plurality of temperatures corresponding to the plurality of voltage peaks.

9. The method of generating a reference voltage as claimed in claim 8, wherein the temperature setting circuit comprises:

a first bipolar transistor, and a voltage-divider circuit including a plurality of voltage dividing resistors connected in series with each other, and applying a predetermined base voltage to a base of the first bipolar transistor, wherein the method of generating the reference voltage further comprises a step of changing at least one temperature corresponding to at least one of the plurality of voltage peaks by changing a resistance value of at least one of the plurality of voltage dividing resistors.

10. The method of generating the reference voltage as claimed in claim 9, further comprising a step of buffering a voltage corresponding to the first correction current from the first correction current generator circuit, and outputting a buffered voltage to the voltage-divider circuit.

11. The method of generating the reference voltage as claimed in claim 8, further comprising a step of, by a plurality of first correction currents, injecting from the plurality of first correction current generator circuits into the band gap reference voltage circuit to generate three or more voltage peaks against change in temperature in the output voltage of the reference voltage generator circuit.

12. The method of generating the reference voltage as claimed in claim 8, wherein the bandgap reference voltage circuit further comprises a second correction current generator circuit that generates a second correction current in response to a change in temperature, wherein the method further comprises a step of, by the second correction current generator circuit, generating another voltage peak in the output voltage of the reference voltage generator circuit in response to the change in temperature by injecting the second correction current into the band gap reference voltage circuit.

13. The method of generating the reference voltage as claimed in claim 12, wherein the second correction current generator circuit comprises a second bipolar transistor and a resistor connected in series with each other, wherein the method of generating the reference voltage further comprises the steps of:

by the second correction current generator circuit, generating the second correction current from a base of the second bipolar transistor, and by the second correction current generator circuit, generating another voltage peak at a temperature higher than the temperature of the voltage peak generated by the first correction current of the first correction current generator circuit.

* * * * *